United States Patent [19]

Bethea et al.

[11] Patent Number: 4,942,442

[45] Date of Patent: Jul. 17, 1990

[54] DEVICE INCLUDING A RADIATION SENSOR

[75] Inventors: Clyde G. Bethea, Plainfield; Daniel Brasen, Lake Hiawatha; Barry F. Levine, Livingston; Ronald H. Willens, Warren, all of N.J.

[73] Assignee: American Telephone and Telegraph Company AT&T Bell Laboratories, Murray Hill, N.J.

[21] Appl. No.: 346,384

[22] Filed: Apr. 27, 1989

Related U.S. Application Data

[63] Continuation of Ser. No. 850,977, Apr. 11, 1986, abandoned.

[51] Int. Cl.[5] ............................................. H01L 49/02
[52] U.S. Cl. .......................................... 357/29; 357/4; 357/30; 357/65; 250/370.01
[58] Field of Search ................. 250/370; 357/2, 4, 15, 357/16, 29, 30 C, 30 E, 30 D, 30 K, 30 N, 50 B, 61, 64

[56] References Cited

U.S. PATENT DOCUMENTS

| | | | |
|---|---|---|---|
| 3,870,887 | 3/1975 | Decker et al. | 250/370 |
| 4,319,258 | 3/1982 | Harnagel et al. | 357/15 |
| 4,509,066 | 4/1985 | Schachter et al. | 357/2 |
| 4,665,412 | 5/1987 | Ohkawa et al. | 357/16 |
| 4,745,452 | 5/1988 | Sollner | 357/16 |

OTHER PUBLICATIONS

*Optical and Infrared Detectors*, Springer-Verlag, edited By R. J. Keyes, 1977, Title Page.
*Nuclear Electronics*, Springer-Verlag, by E. Kowalski, 1977, Title Page.
"Position Sensitive Light Detectors with Standard Silicon-Planar Technology", *Sensors and Actuators*, vol. 4, B. Schmidt, 1983, pp. 439–446.

*Primary Examiner*—William L. Sikes
*Assistant Examiner*—B. R. R. Holloway
*Attorney, Agent, or Firm*—Peter A. Businger

[57] ABSTRACT

Radiation-induced effects discovered in layered structures of conductor and semiconductor materials are utilized in radiation-sensitive devices such as, e.g., highly linear as well as highly nonlinear position sensors. Such devices includes a structure of alternating layers of conductor and semiconductor materials, and electrical contacts are provided between which a radiation-induced voltage appears. Among suitable layer materials are silicon and titanium, and resulting devices are sensitive to electromagnetic as well as to particle radiation.

13 Claims, 1 Drawing Sheet

DEVICE INCLUDING A RADIATION SENSOR

This application is a continuation application Ser. No. 850,977, filed on Apr. 11, 1986.

TECHNICAL FIELD

The invention is concerned with devices including a radiation sensor or detector and, more specifically, with devices including a detector or sensor of electromagnetic or particle radiation.

BACKGROUND OF THE INVENTION

Depending on the type of radiation, and depending further on the specific radiation attribute to be monitored, a great variety of radiation sensors and detectors have been developed for electromagnetic as well as for particle radiation; see, e.g., R. J. Keyes, ed., *Optical and Infrared Detectors*, Springer-Verlag, 1977 and E. Kowalski, *Nuclear Electronics*, Springer-Verlag, 1970.

Sensors and detectors are widely applicable as incorporated in a variety of devices for use in fields such as, e.g., instrumentation, communications, and robotics; with respect to robotics and related fields, position sensing applications are considered as particularly significant. Commercially available position-sensitive photodetectors are based on the photoelectric effect of the p-n junction, typically as implemented in the form of a silicon device. In this respect see, e.g., B. Schmidt et al., "Position-sensitive Photodetectors Made with Standard Silicon-planar Technology", *Sensors and Actuators*, Vol. 4 (1983), pp. 439–446.

P-n junction sensors are based on a physical phenomenon known as Wallmark effect or, more descriptively, as lateral photovoltaic effect; such effect consists in the appearance of a voltage parallel to a p-n junction when such junction is irradiated nonuniformly. For further detail and discussion of the lateral photovoltaic effect see, e.g., G. P. Petersson et al., "Position-sensitive Light Detectors with High Linearity", *IEEE Journal of Solid-state Circuits*, Vol. SC-13 (1978), pp. 392–399 and H. Niu et al., "Application of Lateral Photovoltaic Effect to the Measurement of the Physical Quantities of P-N Junctions - Sheet Resistivity and Junction Conductance of $H_2{}^+$-implanted Si", *Japanese Journal of Applied Physics*, Vol. 15 (1976), pp. 601–609.

While satisfactory p-n junction devices are readily made so long as their dimensions do not exceed a few micrometers, larger-size devices are difficult to make sufficiently uniform. Furthermore, when such devices are intended for position sensing, it has been found difficult to produce a voltage response which is sufficiently linear as a function of the position of a beam. Accordingly, there is demand for photodetectors and radiation sensors having an essentially linear response to the position of incident radiation.

SUMMARY OF THE INVENTION

Radiation-induced electrical effects have been discovered in layered structures of conductor and semiconductor materials such as, e.g., structures of alternating layers of titanium and silicon. Resulting structures are suitable as sensors and detectors of electromagnetic radiation, and these structures are sensitive also to particle radiation such as, e.g., a beam of alpha particles. Resulting sensors, in turn, are suitable for inclusion in a variety of devices like, e.g., position sensors and digital-to-analog converters.

DETAILED DESCRIPTION

Figure 1:
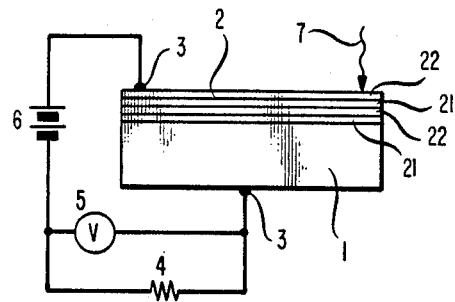
FIG. 1 schematically and in cross section shows a radiation intensity sensor device in accordance with the invention.

Shown in FIG. 1 are substrate 1, film 2 of alternating metallic and semiconductor layers, contacts 3, resistor 4, voltmeter 5, and optional bias potential source 6. When irradiated with electromagnetic or particle radiation 7, voltage across resistor 4 varies as a function of radiation intensity. A bias potential can be used to affect sensitivity of a device; sensitivity increases as a bias voltage is applied in the same direction as the photovoltage and, conversely, an opposing bias voltage reduces sensitivity.

Layer 2 as shown end-on in FIG. 1 (and also in FIGS. 2 and 4) includes a plurality of periods of alternating metallic layers 21 and semiconductor layers 22, a specific instance of two such periods being depicted.

Figure 2:
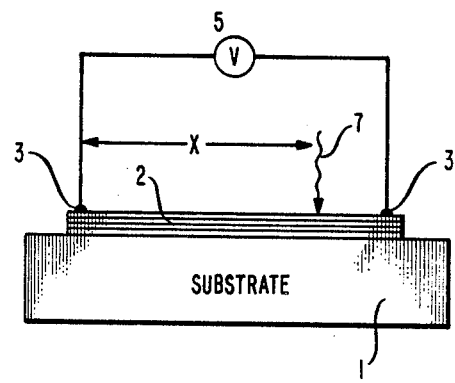
FIG. 2 schematically and in cross section shows a position sensor device in accordance with the invention.

Shown in FIG. 2 are substrate 1, film 2 of alternating metallic and semiconductor layers, contacts 3, and voltmeter 5. When irradiated with radiation 7, voltage between contacts 3 varies as a function of the position, x, of the incident beam. Typically, if a single, x-dimension is to be determined, film 2 is made in the form of a narrow strip which may be rectilinear or curved depending on the path of a light beam. Accordingly, such a device can be used as a transducer for the measurement of position, velocity, acceleration, rotation, strain, temperature, and other scalar-valued quantities. Furthermore, by making a film not as a strip but as covering an area, and by suitable choice of electrodes, 2-dimensional data such as, e.g., x-y-position can be sensed by a resulting device.

Figure 3:
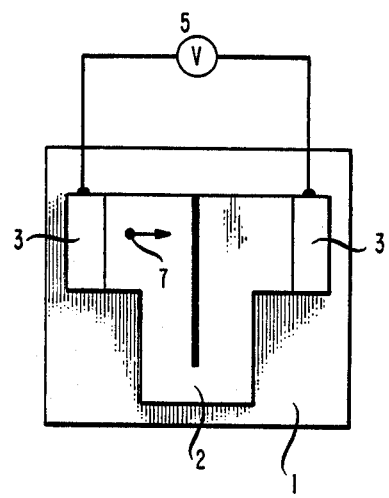
FIG. 3 schematically and in plan view shows an alternate position sensor device in accordance with the invention, having a highly nonlinear voltage response as a function of incident beam position.

Shown in FIG. 3 are substrate 1, film 2 of alternating metallic and semiconductor layers, electrical contacts 3 to the top surface of film 2, and voltmeter 5. As a spot of incidence of radiation 7 moves across a narrow gap in the film, voltage between contacts 3 changes abruptly from an initial polarity to the opposite polarity.

By suitable choice of film geometry it is further possible to combine characteristics of devices in accordance with FIG. 2 and FIG. 3. Resulting devices exhibit low sensitivity for beam positions far from the gap and increased sensitivity as a beam approaches the gap.

Figure 4:
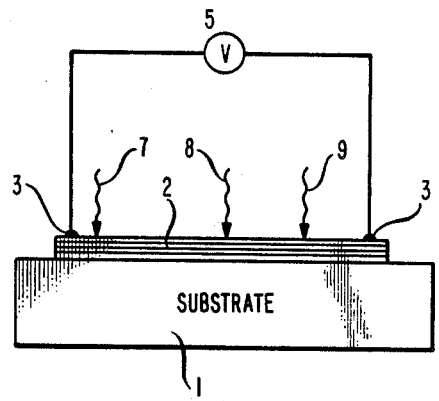
FIG. 4 schematically and in cross section shows a digital-to-analog converter device in accordance with the invention.

Shown in FIG. 4 are substrate 1, film 2 of alternating metallic and semiconductor layers, contacts 3, and voltmeter 5. Three beams of incident radiation 7, 8, and 9 are shown as corresponding to digital input values such that the presence of beam 7 corresponds to a digital value of 4, the presence of beam 8 to a digital value of 1, and the presence of beam 9 to a digital value of 2. (Absence of a beam indicates a corresponding value of 0.) Output voltage measured between contacts 3 is an analog representation of the sum of digital information provided in the form of beams of radiation.

Devices of the invention are sensitive to electromagnetic radiation such as, typically, optical, ultraviolet, or infrared radiation. Also, devices are sensitive to particle radiation such as, e.g., electrons, protons, and alpha particles.

Structures of alternating layers in accordance with the invention can be deposited on insulating substrates or, preferably, on n- or p-type semiconductor substrates; semiconductor substrates are preferred in view of enhanced radiation-induced electrical effects on account of the substrate serving as a pump.

When a substrate material is sufficiently transparent to radiation of interest, incidence of radiation may be through the substrate, such incidence being facilitated in view of direct electrical contact to the layered structure in the absence of a back-electrode. This aspect of the invention is of particular interest for infrared detectors on silicon substrates. Furthermore, absence of contacts to semiconductor substrates is of particular significance where the attachment of contacts would require special care as, e.g., in the case of III—V and II—VI semiconductor materials. Specific examples in this respect are gallium arsenide and mercury-cadmium telluride.

Semiconducting layers such as, e.g., layers of silicon, germanium, or silicon-germanium typically are deposited in amorphous form and having convenient thickness in a preferred range of from 0.1 to 10 micrometers. Semiconductor materials may be p-doped, n-doped, or undoped.

Metallic or conductor layers may be elemental or alloyed, such materials here being defined conveniently in terms of their bulk resistivity of less than 200 microohm-cm. (Bulk resistivity of insulator and semiconductor materials is understood to be greater than 10000 microohm-cm.) Essentially pure titanium is considered to be particularly suitable as a metallic layer material, and zirconium and niobium may be similarly recommended. Preferably, metallic layers are in essentially amorphous form, such form being realized at preferred layer thicknesses which are less than 8 and preferably less than 5 nanometers. For the sake of ease of deposition of continuous layers, thickness of all layers preferably is at least 0.1 nanometer. The number of periods of alternating layers typically is from 1 to 500. Most conveniently, a structure of alternating layers consists of just two types of materials—one metallic and the other semiconducting; however, variation of the composition of such layers is not precluded.

Photoelectric effects observed in accordance with the invention may be accounted for theoretically in terms of the following description. For a structure of alternating layers on a p-substrate and with locally incident light, radiation absorbed in the substrate produces hole-electron pairs. Electrons in the depletion region, within the minority diffusion length, are swept into the film of alternating layers by the Schottky field. Charge separation cancels a portion of the space charge, and this, in turn, reduces the internal barrier potential. The reverse Schottky leakage current, consisting of electrons moving back to the p-region, brings the barrier to an equilibrium configuration by adjusting the local barrier potential so that the rates of photo-generation and recombination are equal.

In the substrate a lateral photovoltage is produced as a result of the separation process of the holes and electrons and the reduction of the barrier potential at the point of incident radiation. Holes in the substrate move laterally under the influence of this gradient in potential. In the metallic film, the lateral driving force for flow of the electrons is attributed to diffusion due to their concentration gradient. A potential gradient develops as the electrons diffuse through the resistive film.

The lateral flows of electrons and holes cancel a portion of the barrier space charge laterally along the junction, and this would result in increased recombination of electrons and holes laterally across the junction if it were not for the high degree of anisotropy of the structure of alternating layers. As a result, the transverse Schottky current is likely to be controlled by transport through multiple layers by thermionic emission and/or diffusion, resulting in a high-grade Schottky junction with recombination not controlled by the initial interface states of the substrate.

EXAMPLE 1.

Alternating layers of titanium and silicon were deposited by electron-beam evaporation on a p-type, 50-ohm-cm silicon substrate having an impurity concentration of approximately $2 \times 10^{14}/cm^3$. During deposition the substrate temperature was in the vicinity of 5 degrees C., and deposition was in a vacuum having a residual atmosphere consisting essentially of hydrogen at a partial pressure of approximately $10^{-8}$ torr (or, approximately $133 \times 10^{-8}$ Pa). Deposition rate was approximately 0.1 nanometer/sec. Individual layers of titanium and silicon had approximate respective thicknesses of 0.6 nanometer and 1.3 nanometer, and a strip consisting of 264 periods of alternating titanium and silicon layers was deposited on an area measuring approximately 20 mm by 2 mm. Ohmic contacts in the form of silver paint were applied to the ends of the strip.

The strip was locally irradiated with laser radiation from a helium-neon laser at a wavelength of approximately 0.63 micrometer, and photovoltage was observed as a function of radiation intensity. Photovoltage increased as a function of intensity, and the increase was essentially linear over a significant domain of intensities.

EXAMPLE 2.

A layered structure was deposited as described in Example 1 above except that the structure had 20 periods, the width of the strip was approximately 1 mm, and the length of the strip was approximately 16 mm. Lateral photovoltage as a function of position of an irradiated spot on the strip was determined by means of laser radiation produced by a low-power helium-neon laser. Lateral photovoltage was found to vary essentially linearly, between zero upon irradiation near an endpoint and approximately 10 mV upon irradiation near the midpoint of the strip. (Deviation from linearity was less than 4 percent.) The photocurrent was measured also, and excellent linearity of current as a function of beam position was observed.

EXAMPLE 3.

A device which acts as a high-sensitivity position detector was made by scratching a layered structure which had been deposited as described in Example 1 above over an area measuring approximately 20 by 20 mm. Contacts were provided as schematically shown in FIG. 3. When the film was irradiated to the left of the scratch, output voltage was approximately 80 mV; as the beam was moved across the scratch, output voltage dropped abruptly to −80 mV.

EXAMPLE 4.

A device which acts as a digital-to-analog converter was made by depositing, as described above in Example 1, a strip 25 mm long and 2 mm wide and having 10 periods of alternating titanium and aluminum. Three sources of gallium arsenide laser radiation were used as schematically shown in FIG. 4, and the following respective approximate output voltages were found for the eight possible digital values 1, 2, 3, 4, 5, 6, 7, and 0 corresponding to on-off combinations of the three beams: 5 mV, 10 mV, 15 mV, −20 mV, −15 mV, −10 mV, −5 mV, and 0 mV.

EXAMPLE 5.

A layered structure was deposited as described in Example 1 above except that the structure had 10 periods, the width of the strip was approximately 2 mm, and the length of the strip was approximately 15 mm. The structure was irradiated locally with radiation whose wavelength was varied from 0.7 to 1.1 micrometer. For wavelengths from 0.7 to approximately 0.95 micrometer, lateral photovoltage was found to be directly related to wavelength; as wavelength was increased further, smooth voltage drop-off was observed.

What is claimed is:

1. Device comprising a radiation-sensitive element which comprises a substrate-supported layered structure consisting of interleaved at least one first and at least one second layers, and first and second electrical contacts to said element, CHARACTERIZED IN THAT said at least one first layer consists of semiconductor material, said at least one second layer consists of conductor material, and said contacts are to the same face of said layered structure.

2. Device of claim 1 in which said structure comprises a plurality of first layers, the composition of said semiconductor material being the same in said structure.

3. Device of claim 1 in which said structure comprises a plurality of second layers, the composition of said conductor material being the same in said structure.

4. Device of claim 1 in which said layered structure is supported by a substrate which consists of an insulator material.

5. Device of claim 1 in which said conductor material consists of titanium.

6. Device of claim 1 in which said semiconductor material is a III—V material.

7. Device of claim 1 in which said semiconductor material is a II—VI material.

8. Device of claim 1 in which said layered structure is supported by a substrate which consists of semiconductor material.

9. Device of claim 1 in which said semiconductor material is a Group-IV material.

10. Device of claim 4 in which said layered structure is supported by a substrate which consists of silicon.

11. Device of claim 9 in which said Group-IV material is silicon.

12. Device of claim 9 in which said Group-IV material is germanium.

13. Device of claim 9 in which said Group-IV material is silicon-germanium.

* * * * *